US005247208A

United States Patent [19]

Nakayama

[11] Patent Number: 5,247,208

[45] Date of Patent: Sep. 21, 1993

[54] SUBSTRATE BIAS GENERATING DEVICE AND OPERATING METHOD THEREOF

[75] Inventor: Akio Nakayama, Hyogo, Japan

[73] Assignee: Mitsubishi Denki Kabushiki Kaisha, Tokyo, Japan

[21] Appl. No.: 828,839

[22] Filed: Jan. 31, 1992

[30] Foreign Application Priority Data

Feb. 5, 1991 [JP] Japan .................................. 3-14059

[51] Int. Cl.[5] ...................... H03K 3/354; H03K 3/017

[52] U.S. Cl. ................................ 307/296.2; 307/264; 307/265; 307/288; 307/296.4; 307/296.5; 307/296.6; 307/296.8

[58] Field of Search ............... 307/264, 265, 288, 290, 307/291, 296.1-296.6, 296.8

[56] References Cited

U.S. PATENT DOCUMENTS 4,142,114 2/1979 Green .................................. 307/304
4,403,158 9/1983 Slemmer ........................... 307/296.2
4,705,966 11/1987 Van Zanten ...................... 307/296.2
4,961,007 10/1990 Kumanoya et al. ............. 307/296.2
4,964,082 10/1990 Sato et al. .................... 307/296.2 X
5,022,005 6/1991 Tohnishi .......................... 365/189.09
5,034,625 7/1991 Min et al. ......................... 307/296.2
5,041,739 8/1991 Goto ................................ 307/296.2
5,072,134 12/1991 Min ................................. 307/296.2
5,113,088 5/1992 Yamamoto et al. ............. 307/296.2

FOREIGN PATENT DOCUMENTS 0174694 3/1986 European Pat. Off. ......... 307/296.2
62-234361(A) 10/1987 Japan .

*Primary Examiner*—William L. Sikes
*Assistant Examiner*—T. Cunningham
*Attorney, Agent, or Firm*—Lowe, Price, LeBlanc & Becker

[57] ABSTRACT

A substrate bias generating circuit including waveform shaping circuits for producing two signals having different phases on the basis of signals in phase extracted from a ring oscillator and two logic gates using these two signals having large phase difference as inputs is disclosed. A first charge pump circuit is driven with one of outputs of these two logic gates and a second charge pump circuit is driven by the other output. First charge pump circuit and second charge pump circuit are electrically coupled to generate substrate bias alternately. Since the difference in phase of two signals inputted to the two logic gates respectively is so large that a possibility is reduced of occurrence of a period in which both of input potential to charge pump circuit and input potential to charge pump circuit are at a low level even if a rise speed and a fall speed of input potential to charge pump circuit greatly differ from a fall speed and a rise speed of input potential to charge pump circuit, respectively. Operation margin of charge pump circuits thus increases.

13 Claims, 10 Drawing Sheets

Vcc
GND
NODE F
NODE G
TIME

TRANSISTOR 23
OFF
ON
OFF
ON

TRANSISTOR 21
ON
OFF
ON
OFF
τ

0
−Vcc
NODE H
NODE I
TIME

TRANSISTOR 22
OFF
ON
OFF
ON

TRANSISTOR 24
ON
OFF
ON
OFF

GND
−Vcc+Vth
−Vcc
NODE K

FIG. 11(a)
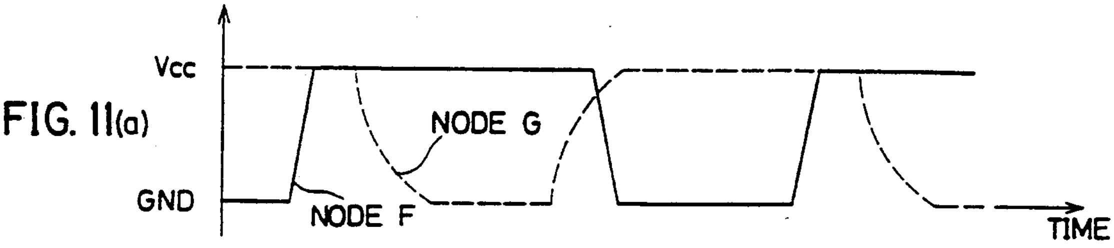
FIG. 11(b)
FIG. 11(c)
FIG. 11(d)
FIG. 11(e)
FIG. 11(f)
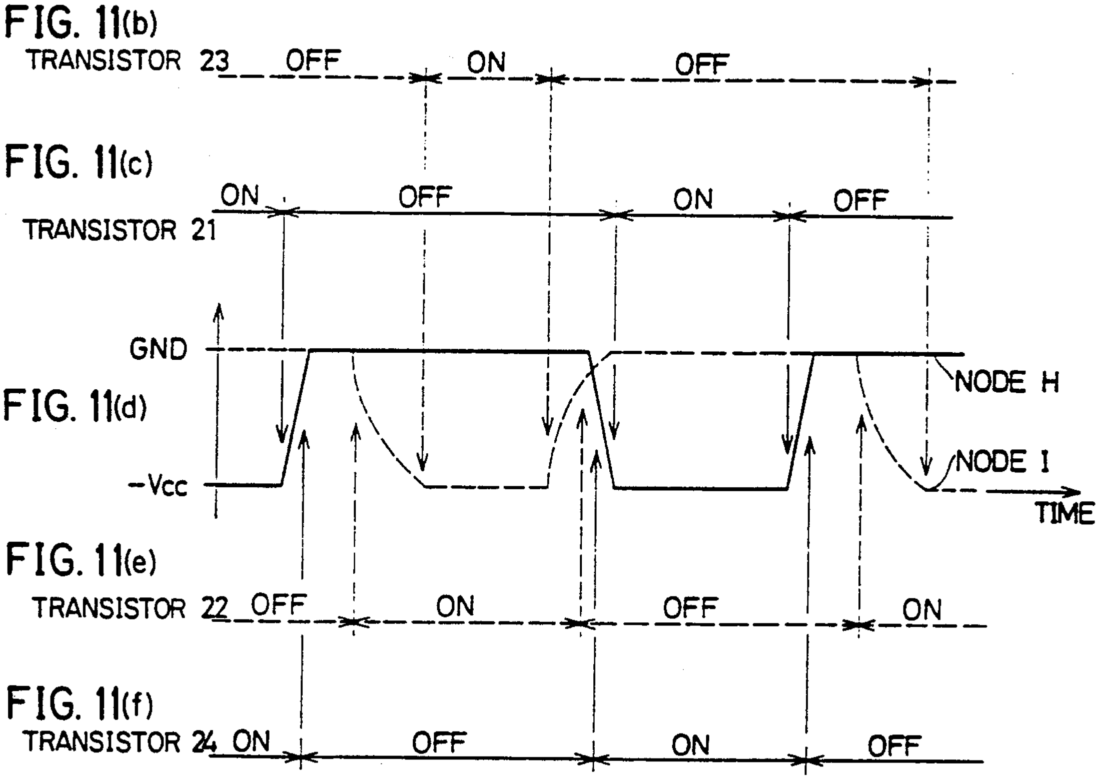
FIG. 11(g)
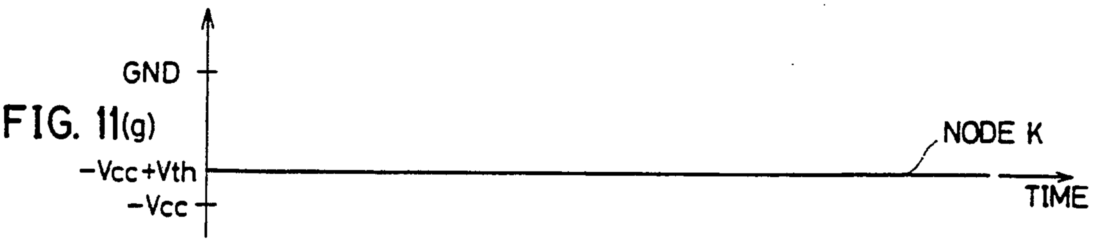

SUBSTRATE BIAS GENERATING DEVICE AND OPERATING METHOD THEREOF

BACKGROUND OF THE INVENTION

1. Field of the Invention

The present invention relates to substrate bias generating devices and operating methods thereof, and more particularly to a substrate bias generating device with a configuration in which substrate bias is generated by driving two charge pumps using outputs of two logic gates using outputs of a ring oscillator as their inputs and an operating method thereof.

2. Description of the Background Art

Semiconductor devices such as a DRAM (Dynamic Random Access Memory) and so forth are semiconductor integrated circuit devices having a large number of MOS transistors formed on a single semiconductor substrate as components. Usually, in such a semiconductor integrated circuit device, the potential of a semiconductor substrate is preferably held at predetermined potential all the time.

FIG. 7 is a diagram illustrating one example of a cross-sectional structure of a part of such a semiconductor integrated circuit device. In FIG. 7, one MOS transistor and an impurity region forming an interconnection region are typically shown. Referring to FIG. 7, the MOS transistor is formed in a region in a surface of a p type semiconductor substrate 130, which includes n type impurity regions 131 and 132 as source and drain regions, and a gate electrode 133. A gate insulating film 134 is formed between gate electrode 133 and p type substrate 130. Corresponding to the voltage applied to the gate electrode 133, a channel is formed between source region 131 and drain region 132. n type impurity region 135 as an interconnection region is provided in a p type substrate 130 surface spaced from impurity region 131. Above the surface of p type substrate 130, a signal line 136 is provided between impurity regions 131 and 135 with a filter insulating film 137 with a large film thickness interposed therebetween.

In FIG. 7, when the MOS transistor is in an ON state, hot electrons and holes paired with them are produced in the vicinity of drain 132. Most of the produced hot electrons flow to drain 132. On the other hand, most of the produced holes flow to p type substrate 130. The potential of p type substrate 130 thus increases. When the potential of p type substrate 130 increases, the following problems occur.

That is, the pn junction formed by each of source region 131 and drain region 132 and p type substrate 130 and the pn junction formed by interconnection region 135 and p type substrate 130 are brought into forward bias states, respectively. As a result, leak current flows between each of source region 131, drain region 132 and interconnection region 135, and p type substrate 130, so that a channel may not be formed between source region 131 and drain region 132 in response to the voltage change for gate electrode 133, or a signal may not be transmitted through interconnection region 135 rapidly.

Also, when interconnection 136 transmits a signal at an operation power supply voltage level, if the potential of p type substrate 130 is high, a channel is likely to be formed in the surface of p type substrate 130 between impurity regions 131 and 135 due to the potential of interconnection 136. That is, a parasitic MOS transistor formed of interconnection 136, insulating film 137, n-type regions 131 and 135 is likely to operate. If such a parasitic element which is originally not a circuit element provided on semiconductor substrate 130 operates, original operation of circuit elements will suffer from bad effects.

Furthermore, a threshold value voltage Vth of a MOS transistor depends on potential of semiconductor substrate 130 in which the MOS transistor is formed. FIG. 8 is a graph illustrating relationship between threshold value voltage Vth of an n-channel MOS transistor formed on a p type semiconductor substrate and potential $V_{BB}$ of the p type semiconductor substrate. On the abscissa in FIG. 8, absolute values of potential $V_{BB}$ become larger as they are separated away from an origin. As seen from FIG. 8, threshold value voltage Vth of a MOS transistor greatly changes depending on change in voltage $V_{BB}$ of a semiconductor substrate in which the MOS transistor is formed in a region with high potential $V_{BB}$ of the semiconductor substrate (a region of $-V1$ or higher in the figure). However, in a region with relatively low potential $V_{BB}$ of the semiconductor substrate (in the figure, region of $-V1$ to $-V2$), the threshold value voltage Vth of the MOS transistor is kept substantially constant with no connection with change in potential $V_{BB}$ of the semiconductor substrate. Accordingly, in FIG. 7, if the potential of p type substrate 130 is about that in a negative potential region ($-V1$ to $-V2$) in FIG. 8, the threshold value voltages of the MOS transistor formed of gate electrode 133, insulating film 134, n-type regions 131 and 132 are not affected by fine fluctuation of potential of p type substrate 130, and it stably operates without causing punch-through and so forth. However, if the potential of p type substrate 130 is high, since the threshold value voltage of the MOS transistor greatly changes in response to small fluctuation of potential of p type substrate 130, the MOS transistor does not operate stably.

In order to avoid such a problem as described above due to an increase in potential of p type substrate 130, negative predetermined potential about that in the potential region ($-V1$ to $-V2$) in FIG. 8 is applied to p type substrate 130, for example. Conventionally, a circuit for generating such negative predetermined potential (hereinafter referred to as substrate bias) to be supplied to a semiconductor substrate (hereinafter referred to as a substrate bias generating circuit) was provided outside a semiconductor substrate. However, a substrate bias generating circuit is recently formed on a semiconductor substrate.

FIG. 6 is a diagram illustrating entire structure of a semiconductor integrated circuit device having a substrate bias generating circuit. Referring to FIG. 6, a semiconductor integrated circuit device 100 having a MOS transistor as a component includes a functional circuit 110 and a substrate bias generating circuit 120 formed on a semiconductor substrate 130. Functional circuit 110 implements original functions of the semiconductor integrated circuit device. On the other hand, substrate bias generating circuit 120 generates negative predetermined potential as substrate bias. The generated substrate bias $V_{BB}$ is applied to semiconductor substrate 130. Thus, the problem of occurrence of malfunctions due to potential of semiconductor substrate 130 in functional circuit 110 can be avoided.

FIG. 4 is a diagram illustrating one example of a circuit used as the substrate bias generating circuit 120 in FIG. 6. FIG. 5 is a timing chart diagram for describing operation of the substrate bias generating circuit shown in FIG. 4. Referring to FIGS. 4 and 5, structure and operation of a conventional substrate bias generating circuit will be described below.

Referring to FIG. 4, the conventional substrate bias generating circuit includes a ring oscillator 30, a waveform shaping circuit 40, charge pump circuits 50 and 51, 2-input NOR gate 17 and a 2-input NAND gate 16.

Ring oscillator 30 includes seven inverters 1–7 connected in series. Output potential of inverter 7 at the seventh stage is inputted into inverter 1. Accordingly, an output logic level of each of inverters 1–7 switches, that is, oscillates, in a cycle corresponding to a delay time of six inverters. Respective output potentials of inverters 1, 3, 5 and 7 are substantially in phase and also output potentials of inverters 2, 4, and 6 are also substantially in phase. Output potential of inverter 3 shows phase which is delayed by a delay time by two inverters as compared to output potential of inverter 1, output potential of inverter 5 shows phase delayed by a delay time by two inverters in addition as compared to output potential of inverter 3, and output potential of inverter 7 shows phase further delayed by a delay time by two inverters as compared to output potential of inverter 5. Output potential of inverters 2, 4 and 6 and output potential of inverters 1, 3, 5 and 7 are opposite in phase. The output potential of inverter 2 shows phase different from the output potential of inverter 1 by 180°, the output potential of inverter 4 shows phase delayed by a delay time due to two inverters as compared to the output potential of inverter 2, and the output potential of inverter 6 shows phase delayed by a delay time due to two inverters in addition as compared to the output potential of inverter 4.

Waveform shaping circuit 40 includes p channel MOS transistors 8 and 9 and n channel MOS transistors 10 and 11 provided between a power supply Vcc and ground. Gates of transistors 8 and 11 are connected to an output terminal (node B) of inverter 5, and gates of transistors 9 and 10 are connected to an output terminal (node C) of inverter 7. Accordingly, transistor 8 and transistor 11 turn on and off complementarily to each other, and transistor 9 and transistor 10 turn on and off complementarily to each other. The potential of node B and the potential of node C show phases different by delay time by two inverters (refer to FIG. 5 (*a*)), so that times are short in which both of transistors 8 and 9 are in ON states, and in which transistors 10 and 11 are both in ON states. On the other hand, the potential at a connecting point E of transistors 9 and 10 rises by high voltage of power supply Vcc in response to turn-ON of both of transistors 8 and 9 and falls by ground potential in response to turn-ON of both of transistors 10 and 11. Accordingly, the potential at the node E has the same phase as that of the potential at node C, as shown by a solid line in FIG. 5 (*b*), and also more sharply changes than the potential at node C. That is, the potential waveform at node C is shaped and appear at node E.

The potential at node E is transmitted to node J through inverters 25 and 26. The rise and fall of potential at node E is so sharp that the potential waveform at node E is transmitted to node J with its phase being not delayed almost at all by inverters 25 and 26 (refer to the broken line in FIG. 5 (*b*)).

Potentials at nodes E and J are both applied to a NOR gate 17 and a NAND gate 16. Accordingly, an output of NOR gate 17 attains a high level only in a period in which both potentials of nodes E and G are at a low level as shown in FIG. 5 (*d*). On the other hand, an output of NAND gate 16 attains a low level in a period in which both of potentials of nodes E and G are at a high level as shown in FIG. 5 (*c*).

An output of NOR gate 17 is inverted by inverter 18. Accordingly, an output of inverter 18 shows phase different from an output of NAND gate 16 by substantially 180° as shown in FIG. 5 (*e*). An output of inverter 18 and an output of NAND gate 16 are respectively inputted into charge pump circuits 50 and 51. Charge pump circuit 50 includes a capacitor 20 and a p channel MOS transistor 23 connected in series between an output terminal (node G) of inverter 18 and substrate 130, and p channel MOS transistor 24 provided between a connecting point of capacitor 20 and transistor 23 and ground. Charge pump circuit 51 includes a capacitor 19 and p channel MOS transistor 21 connected in series between an output terminal (node F) of NAND gate 16 and substrate 130, and p channel MOS transistor 22 provided between connection point of capacitor 19 and transistor 21 and ground. Each of transistors 23 and 21 is diode-connected. ON/OFF of transistor 22 is controlled by the potential at node I and ON/OFF of transistor 24 is controlled by the potential at node H. The back gate bias voltage of transistors 21 and 22 is output voltage of NAND gate 16 and back gate bias voltage of transistors 23 and 24 is output voltage of inverter 18.

In the description below, potential higher and potential lower than potential intermediate between power supply voltage Vcc and ground voltage 0V (Vcc/2) are respectively referred to as a high level voltage and a low level voltage.

In charge pump circuit 50, when the potential at node G falls to ground potential from power supply potential Vcc, the potential at node I also starts decreasing by coupling of capacitor 20 in response to that. On the other hand, in charge pump circuit 51, the potential at node F increases from ground potential to power supply potential Vcc, so that the potential at node H starts increasing by coupling of capacitor 19. When transistor 29 is brought into an OFF state with a potential increase at node H, accumulating of negative charge discharge from capacitor 20 is started at node I since a discharge path of capacitor 20 is disconnected. Thus, the potential at node I starts dropping to ground potential or below, and finally attains a negative potential (−Vcc) having an absolute value same as power supply potential Vcc. Accordingly, transistor 23 comes in an ON state and applies to substrate 130 potential (−Vcc+Vthp) higher than the potential (−Vcc) at node I by threshold value voltage Vthp of the p channel MOS transistor as substrate bias $V_{BB}$. On the other hand, since transistor 22 turns on in response to fall of potential at node I, the potential at node H attains ground potential higher than the potential at node K (−Vcc+Vthp). Accordingly, transistor 21 attains an OFF state. Transistor 23 is turned on to supply negative potential (−Vcc+Vthp) to substrate 130, and a state in which transistor 21 is in an OFF state is maintained for a period in which the potential at node G is at a low level (in a period in which the potential at node F is at a high level).

On the contrary, at a fall of potential at node F, charge pump circuit 51 performs the same operation as that of charge pump circuit 50 at a fall of potential at node G.

When the potential at node F falls from power supply potential Vcc to ground potential, the potential at node H also starts decreasing by coupling of capacitor 19 in response to that. On the other hand, since the potential at node I increases in response to rise of potential at node G in charge pump circuit 50, transistor 22 is brought into an OFF state. Thus, the discharge path of capacitor 19 is cut off, so that the potential at node H decreases to negative potential (−Vcc) having the same absolute value as power supply potential Vcc. As a result, the potential at node K finally attains potential higher than the potential at node H by said threshold value voltage Vthp (−Vcc+Vthp). In charge pump circuit 50, transistor 24 turns on upon fall of potential at node H in charge pump circuit 51 to bring node I into ground potential. Accordingly, transistor 23 comes in an OFF state in charge pump circuit 50. Such a condition under which transistor 23 is in an OFF state and transistor 21 outputs negative potential (−Vcc+Vthp) to substrate 130 is maintained for a period in which the potential at node F is at a low level (a period in which the potential at node G is at a high level).

As a result of such circuit operation, negative constant potential (−Vcc+Vthp) is generated from the substrate bias generating circuit all the time.

Now, in view of reducing consumption power, a level inversion cycle of output potential of a ring oscillator, (i.e., oscillation cycle of a ring oscillator) is set to be relatively long in a conventional substrate bias generating circuit. For example, in FIG. 4, if the oscillation cycle of ring oscillator 30 is short, output potential of each of inverters 1–7 attains a high level in a short cycle. Accordingly, the consumption power at ring oscillator 30 increases. The oscillation cycle of a ring oscillator is therefor set to be relatively long. Specifically, the oscillation frequency of a ring oscillator has been approximately 200 ns in conventional cases, but it is approximately 2 μs for reducing consumption current presently. When the oscillation frequency of a ring oscillator is approximately 200 ns, the consumption power of the ring oscillator is approximately 40 μA, and the consumption current in the entirety of a substrate bias generating circuit is approximately 500 μA, but, when the oscillation frequency of a ring oscillator is approximately 2 μs, the consumption current of the ring oscillator is approximately 4 μA, and the consumption current in the entirety of the substrate bias generating circuit is approximately 15 μA.

For making the oscillation cycle of a ring oscillator long, a signal delay time of each inverter constituting the ring oscillator is set to be long. Accordingly, a size of a MOS transistor constituting each inverter is made small to reduce a driving capability of each inverter. When a size of a transistor constituting each inverter is small, potential at an output terminal of each inverter is not easily changed following change of output potential of an inverter at a previous stage, resulting in an increase in a delay time in each inverter. Such a measure is taken in order to make an oscillation cycle of a ring oscillator long, so that a rising time and a falling time of output potential of a ring oscillator increase. That is, rounding occurs in an output potential waveform of a ring oscillator. Accordingly, the output potential of ring oscillator 30 in FIG. 4 (the potential at nodes B and C) rises and falls slowly as shown in FIG. 5 (*a*). A waveform shaping circuit 40 is provided for removing such rounding of an output potential waveform of a ring oscillator.

As described above, in a conventional substrate bias generating circuit having a structure in which two charge pumps are driven using outputs of two logic gates receiving outputs of a ring oscillator, a phase of potential input into one charge pump circuit and a phase of potential input into the other charge pump circuit are set differing by 180°. This is for avoiding occurrence of a period in which both of input potential to the one and input potential to the other attain a low level. If both of input potentials attain a low level, problems as follows are caused.

For example, in FIG. 4, suppose that the potential at node G falls from power supply potential Vcc to ground potential, and the potential at node F still remains at a low level. In such a case, when the potential at node I is on the decrease, the potential at node H is still low level, and a period in which transistor 24 stays in an ON state is caused. In this period, since node I is rounded, the discharge path of capacitor 20 is not broken. Accordingly, the potential at node I does not decreases to potential (−Vcc) to which it originally should decrease, and gets near ground potential 0V. On the other hand, if the potential at node G still stays at a low level at a time of potential fall at node F, since a period occurs in which transistor 22 stays in an ON state in charge pump circuit 51, the potential at node H does not sufficiently decreases and gets nearer to ground potential. As a result, substrate bias $V_{BB}$ gets higher than ideal potential (−Vcc+Vthp).

In order to solve such a problem, a conventional substrate bias generating circuit is made so that the potential at node F and the potential at node G are always at complementary levels. However, with high scale integration of semiconductor integrated circuit devices in these days, there are some cases where even circuit elements originally to be formed having the same sizes must be formed having different sizes because of some reasons related to occupied areas on a semiconductor substrate and the like. In the substrate bias generating circuit in FIG. 4 for example, capacitor 19 and capacitor 20 may be formed with different sizes on semiconductor substrate 130. Capacitors 19 and 20 are provided for accumulating negative charge for obtaining negative potential having a relatively large absolute value. Accordingly, capacitances of capacitors 19 and 20 must be certain values or larger. However, a size of either one of capacitor 19 and 20 may be sometimes made smaller in view of layout on a semiconductor substrate.

Accordingly, in such a case, a method is taken in which a size of the other capacitor is made large. As a result, the capacitance of capacitor 19 and the capacitance of capacitor 20 are not equal. Occurrence of unbalance between capacitances of capacitors 19 and 20 causes a period in which both of the potential at node F and the potential at node G are at a low level.

If the capacitance of capacitor 19 and the capacitance of capacitor 20 are equal to each other, the capability of capacitor 20 to keep the potential at node G constant is equal to the capability of capacitor 19 to keep the potential at node F constant. Accordingly, the time required by the potential of node G to rise in response to rise of an output of inverter 18 and the time required by the potential of node F to rise in response to the rise of an output of NAND gate 16 are equal, and a time required by the potential at node G to fall in response to the rise of an output of inverter 18 and a time required by the potential at node F to fall in response to a fall of NAND gate 16 are also equal to each other. Accordingly, as shown in FIG. 5 (*f*), the potential at node G is always at a high level when the potential at node F falls and the potential at node F is always at a high level when the potential at node G falls.

For example, however, if the capacitance of capacitor 20 is extremely larger than the capacitance of capacitor 19, a time required by the potential of node G to fall in response to a fall of an output of inverter 18 is considerably longer than a time required by the potential at node F to fall in response to a fall of potential at NAND gate 16. As a result, potentials at nodes F and G show waveforms as shown by a solid line and a broken line in FIG. 5 (*g*), respectively. As seen from FIG. 5 (*g*), a phenomenon occurs in which even when node F falls to a low level, the potential at node G still remains at a low level. On the other hand, if the capacitance of capacitor 19 is extremely larger than the capacitance of capacitor 20, a phenomenon occurs in which even if the potential at node G falls to a low level, the potential at node F still remains at a low level.

If the capacitance of capacitor 20 is large, as shown in FIG. 9 (*a*), when the potential at node F attains a low level, the potential at node G is on the gradual increase from the potential it used to be (−Vcc). Accordingly, an instance exists at which the potential at node I attains potential (−Vcc+Vthp) at which transistor 22 can be brought into an ON state in a period in which the potential at node H is on the decrease. Next, the potential change of nodes in charge pumps 50 and 51 are specifically described referring to FIG. 9 in an example in which the capacitance of capacitor 20 is extremely larger than the capacitance of capacitor 19.

FIG. 9 is a timing chart diagram illustrating operation of charge pumps 50 and 51 when the capacitance of capacitor 20 is much larger than the capacitance of capacitor 19.

The potential of node G (FIG. 9 (*a*)) completely attains a low level when a certain time has passed after the potential at node F rises to a high level and gradually starts rising at the time at which the potential at node F has almost completely fallen. Accordingly, as shown in FIGS. 9 (*b*) and (*c*), transistor 23 switches from an OFF state to an ON state when a certain time has passed after transistor 21 switches from an ON state to an OFF state, and, as shown in FIGS. 5 (*e*) and (*f*), transistor 22 switches from an ON state to an OFF state when a certain time has passed after transistor 24 had switched from an OFF state to an ON state. Since transistor 23 is not brought into an ON state unless the potential at node I becomes lower than the substrate potential, it switches from an ON state to an OFF state somewhat later than transistor 22. Similarly, since transistor 21 does not attain an ON state unless the potential at node H becomes lower than the substrate potential, it switches to an ON state somewhat logging behind transistor 24.

On the other hand, the potential at node H starts rising by the potential at a high level at node F in response to switch of transistor 21 into an OFF state and attains power supply potential Vcc by change of transistor 22 into an ON state thereafter, as shown by a solid line in FIG. 9 (*d*). Subsequently, the potential at node H starts falling in response to a fall of the potential at node F and attains −Vcc by the change of transistor 22 into an OFF state.

The potential at node I slowly rises following the potential change at node G in response to the switch of transistor 23 into an OFF state as shown by a broken line in FIG. 9 (*d*) to attain power supply potential Vcc. Subsequently, the potential at node I gradually falls following the fall of potential at node G in response to switch of transistor 24 into an OFF state to attain −Vcc.

Accordingly, in the period in which the potential at node I is decreasing, an instance at which both of transistors 23 and 24 attain an ON state does not occur, but when the potential at node H is decreasing, an instance $\tau$ occurs at which both transistors 21 and 22 are at an ON state. Accordingly, node K is instantly grounded through transistors 23 and 24 to increase the potential at node K. Such a phenomenon is caused every time the potential at node F falls, so that the potential at node K becomes stable at potential somewhat higher than (−Vcc+Vthp) as shown in FIG. 9 (*g*) after starting operation of ring oscillator 30.

On the other hand, if the capacitance of capacitor 19 is large, the potential at node H is gradually increasing from the potential (−Vcc) it used to be when the potential at node G attains a low level. Accordingly, an instance occurs at which transistor 24 is brought into an ON state in a period in which the potential at node I is decreasing. Accordingly, in such a case, a phenomena occurs in which node K is grounded every time the potential at node G falls. Therefore, also in such a case, the potential at node K becomes stable at potential higher than original potential (−Vcc+Vthp) as shown in FIG. 9 (*g*).

FIG. 10 is a graph schematically showing change of substrate potential, i.e. the potential at node K in FIG. 4, after a time of starting operation of a conventional substrate bias generating circuit.

Referring to FIG. 10, when the substrate potential is 0V immediately before the substrate bias generating circuit operates, the potential at node K actually decreases gradually as shown by the solid line. If an instance does not occur at which the potential at node G and the potential at node F simultaneously attain a low level in FIG. 4, the potential at node K, thereafter, as shown by the broken line, is stabilized at potential higher than negative potential (−Vcc) having an absolute value the same as the power supply potential by threshold value voltage Vthp of a P channel MOS transistor. If an instance occurs at which the potential at node G and the potential at node F both attain a low level simultaneously, however, the potential at node K becomes stabilized at potential higher than such potential (−Vcc+Vthp) after that.

As described above, if there exists significant difference in capacitance between capacitors 20 and 19 respectively included in charge pump circuits 50 and 51, sufficient amount of negative charge is not accumulated in these charge pump circuits. Accordingly, a conventional substrate bias generating circuit had a problem that a generating efficiency of substrate bias $V_{BB}$ becomes inferior if the difference in capacitance is large between a capacitor included in one of two charge pump circuits and a capacitor included in the other.

Because as the oscillation frequency of a ring oscillator is lower, the rounding of an output potential waveform of the ring oscillator is larger, the rounding is likely to be caused in the potential waveform appearing at an input end (nodes F and G in FIG. 4) of a charge pump in a substrate bias generating circuit when the capacitances of capacitors 19 and 20 in the charge pump are larger. Accordingly, since oscillation frequency of a ring oscillator is presently set low, problems as mentioned above are more serious.

In order to avoid such a problem, for example in FIG. 4, the following method is a possibility in which it is made easier that the potential at node G changes following the change in potential of an output of inverter 18 by making driving capability of inverter 18 large (when the capacitance of capacitor 20 is large), or it is made easy that the potential at node F changes following change in potential of an output of NAND gate 16 by making driving capability of NAND gate 16 large (when capacitance of capacitor 19 is large). However, according to such a method, inverter 18 and NAND gate 16 must be made large in size, resulting in a new problem of an increase in consumption power.

SUMMARY OF THE INVENTION

It is an object of the present invention to provide a substrate bias generating device capable of generating substrate bias efficiently.

It is another object of the present invention to provide a substrate bias generating device which surely generates substrate bias sufficiently lower than ground potential.

It is still another object of the present invention to provide a substrate bias generating device which can surely generates substrate bias sufficiently lower than ground potential using at least two charge pump circuits.

It is yet another object of the present invention to provide a substrate bias generating device capable of surely generating substrate bias sufficiently lower than ground potential regardless of difference in capacitance between a capacitor included in a first charge pump circuit and a capacitor included in a second charge pump circuit.

It is still another object of the present invention to provide a substrate bias generating device efficiently generating substrate bias without causing an increase in consumption current.

It is yet another object of the present invention to provide a substrate bias generating device which surely generates substrate bias at a predetermined potential regardless of difference in capacitance between a capacitor included in a first charge pump circuit and a capacitor included in a second charge pump circuit without making large driving capability of a circuit driving the first charge pump circuit and the driving capability of a circuit driving the second charge pump circuit.

In order to achieve the above-mentioned objects, a substrate bias generating circuit according to the present invention includes a ring oscillator including a plurality of inverter circuits serially connected in a ring, a first signal generating circuit, a second signal generating circuit, and first and second charge pump circuits respectively provided corresponding to the first and second signal generating circuits.

The first signal generating circuit supplies a first logic signal having a periodically inverting logical level inverting in a certain cycle on the basis of a first output signal of the ring oscillator. The second signal generating circuit generates in a first period in which an output signal of the first signal generating circuit is at a first logic level, a second logic signal having a second logic level during the first period for a second period shorter than the first period, and generates a signal having the first logic level in other periods. The first charge pump circuit includes a first capacitance coupling element charged in response to the first output signal having the first logic level of an output signal of the first signal generating means, and a first discharging circuit for discharging the first capacitance coupling element to a semiconductor substrate in response to the second output signal having the second logic level. Similarly, the second charge pump circuit includes a second capacitance coupling element charged in response to the second output signal having the first logic level of an output signal of the second signal generating circuit and a second discharging circuit for discharging the second capacitance coupling element to the semiconductor substrate in response to the second output signal having the second logic level.

The first capacitance coupling element is connected to a predeterminal potential souece in response to the second output signal having the second logic level. The second capacitance poupling element is connected to the potential source in response to the first output signal having the second logic level.

Preferably, first, second and third signals having phases a little bit different from each other are obtained from the ring oscillator, the first signal generating circuit includes a first signal producing circuit and a first logic gate circuit, and the second signal generating circuit includes a second signal producing circuit and a second logic gate circuit. The first signal producing circuit produces a fourth signal on the basis of first and second signals from the ring oscillator. On the other hand, the second signal producing circuit produces a fifth signal having phase different from the fourth signal on the basis of second and third signals from the ring oscillator circuit. The first logic gate circuit has the fourth and fifth signals as input, and outputs a signal of the second logic level when both of them are at predetermined logic levels. On the other hand, the second logic gate circuit has the fourth and fifth signals as inputs, and outputs a signal of the first logic level when at least one of them is at the predetermined logic level.

According to another aspect, a substrate bias generating device according to the present invention includes a first charge pump circuit including a first capacitance coupling element which is charged in response to a signal of a first logic level and a first electric path circuit for discharging the first capacitance coupling element, a second charge pump circuit including a second capacitance coupling element which is charged in response to the first logic level signal and a second electric path circuit for discharging the second capacitance coupling element, a first signal providing circuit and a second signal providing circuit.

The first signal providing circuit provides a signal of the first logic level in predetermined periods at constant intervals to the first capacitance coupling element. The second signal providing circuit provides in the predetermined period in which an output signal of the first signal providing circuit attains the first logic level a signal of the second logic level in a period shorter than the predetermined period and provides the first logic level signal in other periods.

Each of the first and second electric path circuits is activated in response to a signal of the second logic level.

In the substrate bias generating device, there further provided a first connecting circuit responsive to a signal of the first logic level from the first signal providing circuit for electrically connecting a connection point of the first capacitance coupling element and the first electric path circuit to the substrate, and a second connecting circuit responsive to a signal of the second logic level from the second signal providing circuit for electrically connecting a connection point of the second capacitance coupling element and the second electric path circuit to the substrate.

In order to achieve the above-described objects, a method of operating a substrate bias generating circuit according to the present invention is applied to a substrate bias generating circuit including a first charge pump circuit including a first capacitance coupling element charged in response to a signal of a first logic level and a first discharge circuit discharging the first capacitance coupling element to a semiconductor substrate in response to a signal having a second logic level and a second charge pump circuit including a second capacitance coupling element charged in response to a signal of the first logic level and a second discharge circuit discharging the second capacitance coupling element to a semiconductor substrate in response to a signal having the second logic level, and includes the steps of generating a first signal having its logic level inverting at constant cycle, generating a second signal which attains, in a first period in which the generated first signal is at the first logic level, the second logic level during the first period for a second period shorter than the first period and attains the first logic level in other periods, supplying the generated first signal to the first capacitance element, supplying the generated second signal to the second capacitance coupling element, electrically connecting the first capacitance coupling element to a predetermined potential source in response to the second signal having the second logic level, and electrically connecting the second capacitance coupling element to the potential source in response to the first signal having the second logic level.

A substrate bias generating device and an operating method thereof according to the present invention are configured as described above, so that a time in which a signal to be supplied to a second capacitance coupling element attains a first logic level and then a signal to be supplied to a first capacitance coupling element attains a second logic level, and a time in which a signal to be supplied to a first capacitance coupling element attains the first logic level and a signal to be supplied to a second capacitance coupling element attains the second logic level are longer than those in a conventional case. Accordingly, a possibility is reduced that the second capacitance coupling element is connected to the predetermined potential source in a period in which a signal supplied to the second capacitance coupling element is at the second logic level in the second charge pump circuit when a rising rate and a falling rate of a signal supplied to the first capacitance coupling element are slow. Similarly, a possibility is also reduced that the first capacitance coupling element is connected to the predetermined potential source during a period in which a signal supplied to the first capacitance coupling element is at the second logic level in the first charge pump means when rising rate and falling rate of a signal supplied to the second capacitance coupling element are slow. Accordingly, negative charge discharged from each of the first and second capacitance coupling elements is sufficiently supplied to the substrate.

Accordingly, according to the present invention, an operation margin of a charge pump circuit can be made larger without enhancing the driving capability of a circuit provided at a previous stage of a charge pump circuit or providing a new delay circuit. As a result, without occurrence of demerits such as an increase of consumption power, the performance of a substrate bias generating device can be considerably improved. Accordingly, in a semiconductor integrated circuit device in which a substrate bias generating device according to the present invention is provided, a possibility of occurrence of malfunctions due to potential of a semiconductor substrate is reduced as compared to conventional cases, so that an improvement of performance of a semiconductor integrated circuit device requiring a substrate bias generating device is expected.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 11(*a*)-11(*g*) are timing chart diagrams illustrating operation of charge pumps 50 and 51 when the capacitance of capacitor 20 is much larger than the capacitance of capacitor 19 in the substrate bias generating circuit of FIG. 2.

DESCRIPTION OF THE PREFERRED EMBODIMENTS

Figure 1:
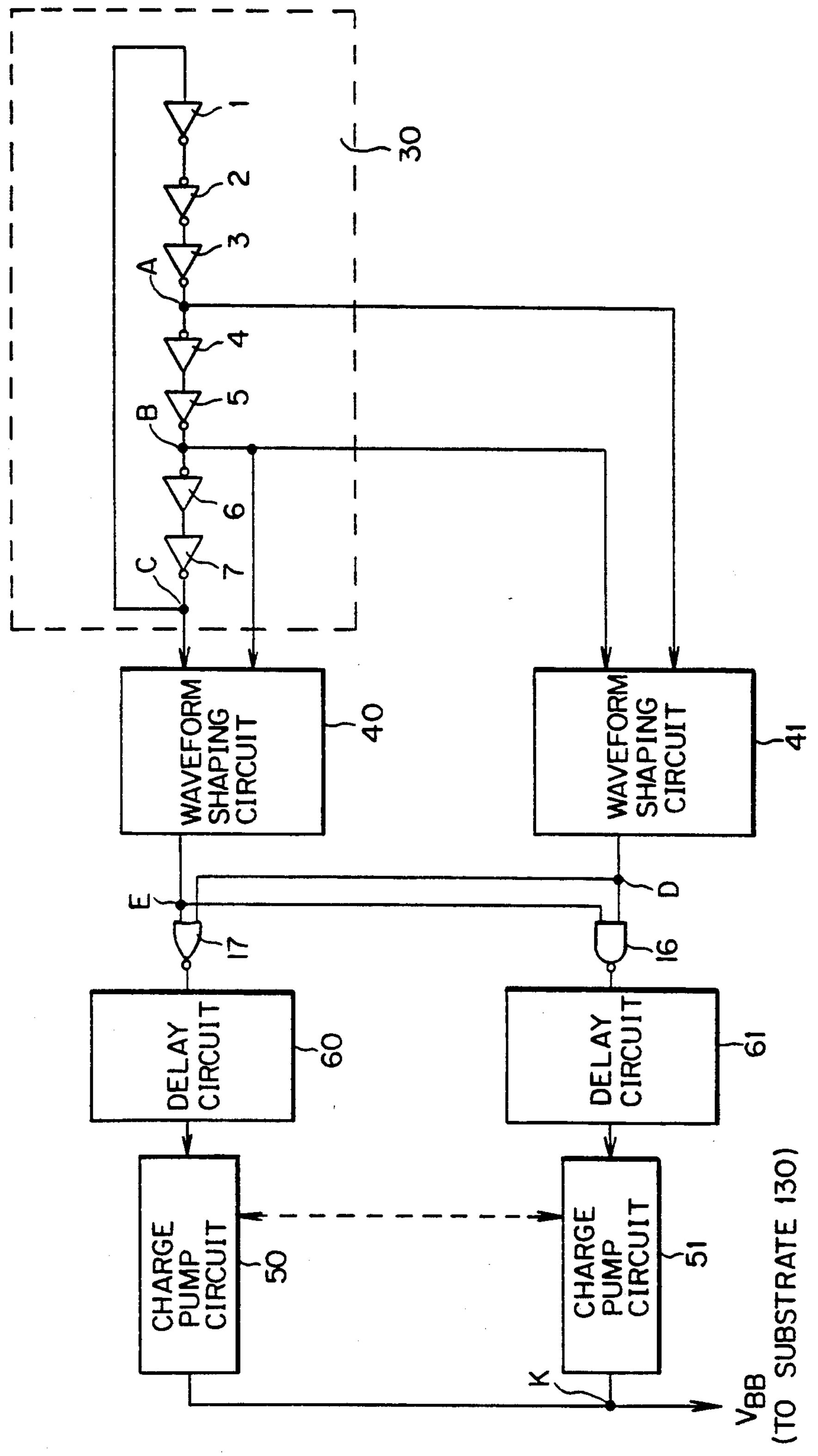
FIG. 1 is a diagram conceptually illustrating configuration of a substrate bias generating circuit of one embodiment of the preset invention.

FIG. 1 is a diagram conceptually illustrating configuration of a substrate bias generating circuit of one embodiment of the present invention. Referring to FIG. 1, a substrate bias generating circuit of the present embodiment includes a ring oscillator 30, two waveform shaping circuits 40 and 41, 2-input NOR gate 17 and 2-input NAND gate 16, two delay circuits 60 and 61, and two charge pump circuits 50 and 51 which operate relating to each other.

Figure 4:
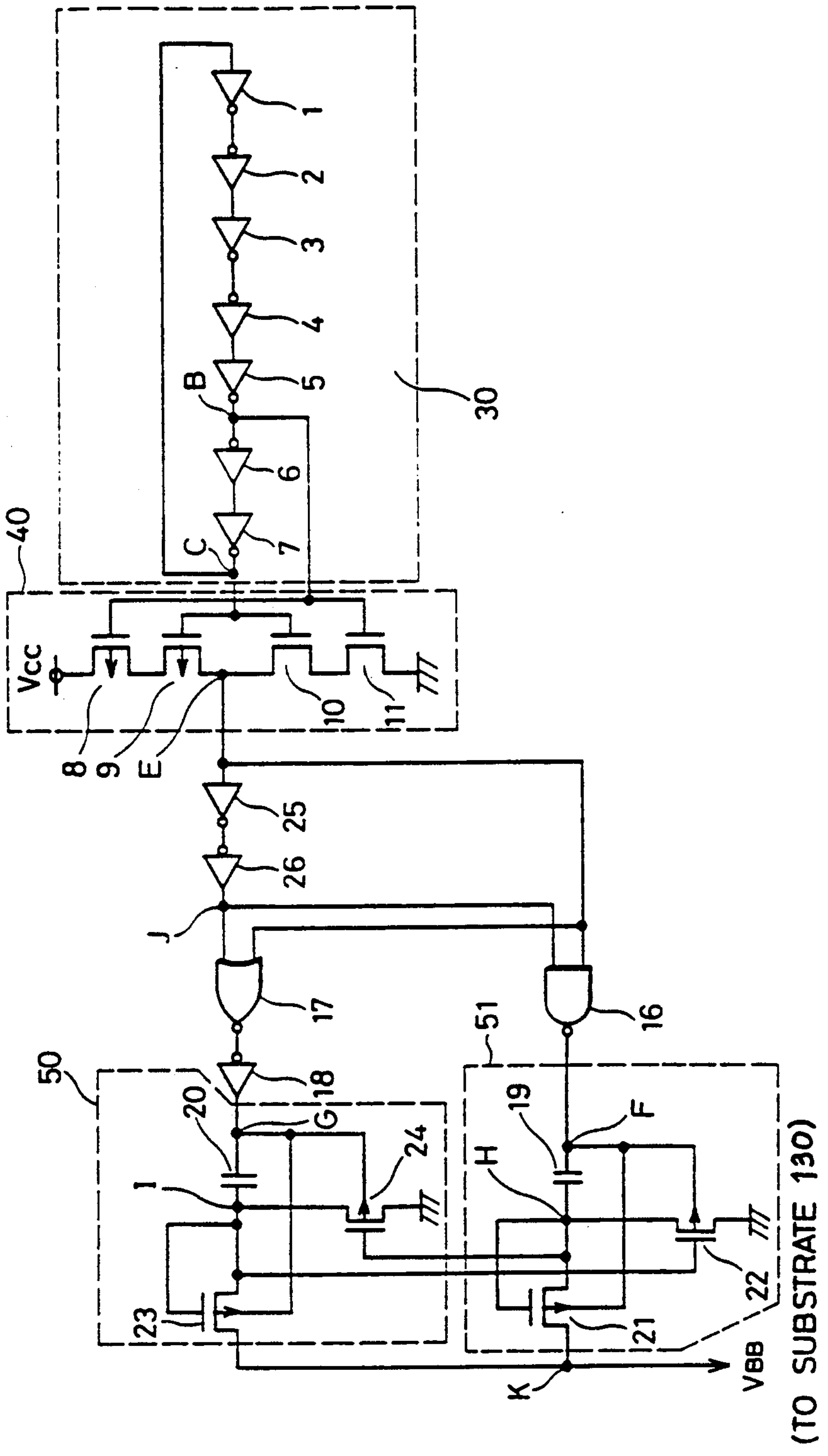
FIG. 4 PRIOR ART
FIG. 4 is a circuit diagram showing structure of a conventional substrate bias generating circuit.
Figure 5A:
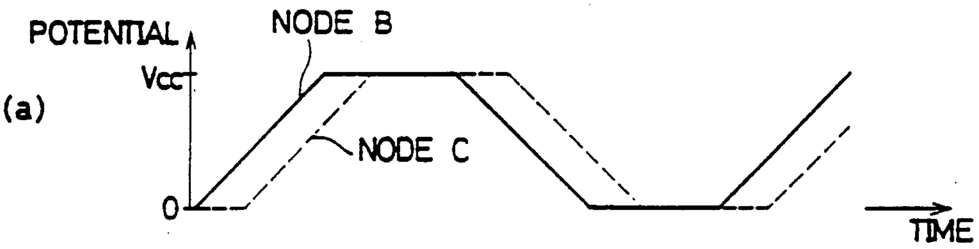
FIG. 5(a) PRIOR ART
FIGS. 5(*a*)-5(*g*) are timing chart diagrams for describing operation of the substrate bias generating circuit shown in FIG. 4.
Figure 5B:
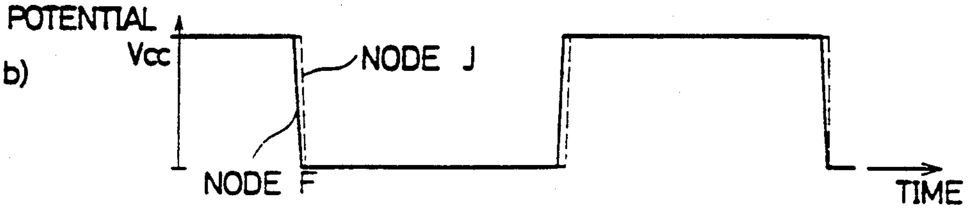
FIG. 5(b) PRIOR ART
Figure 5C:
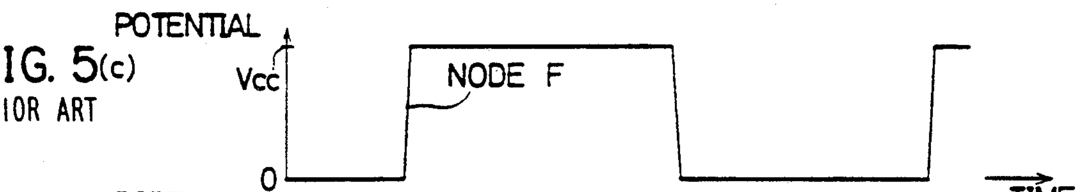
FIG. 5(c) PRIOR ART
Figure 5D:
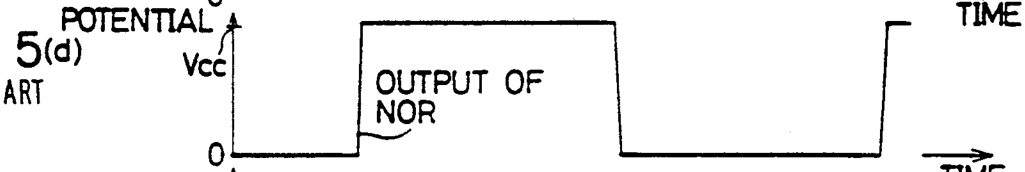
FIG. 5(d) PRIOR ART
Figure 5E:
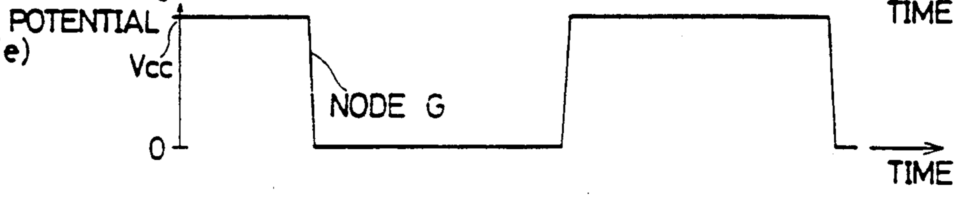
FIG. 5(e) PRIOR ART
Figure 5F:
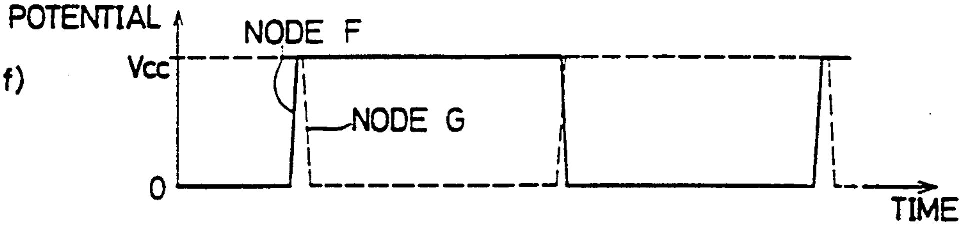
FIG. 5(f) PRIOR ART
Figure 5G:
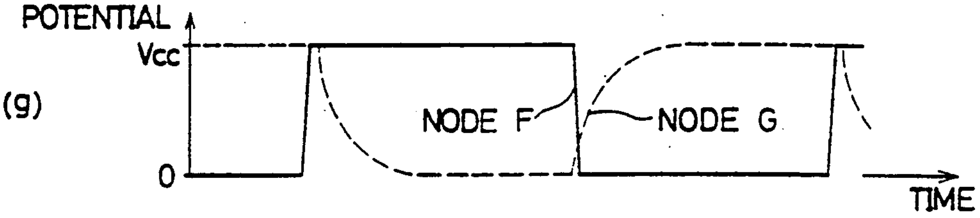
FIG. 5(g) PRIOR ART
Figure 6:
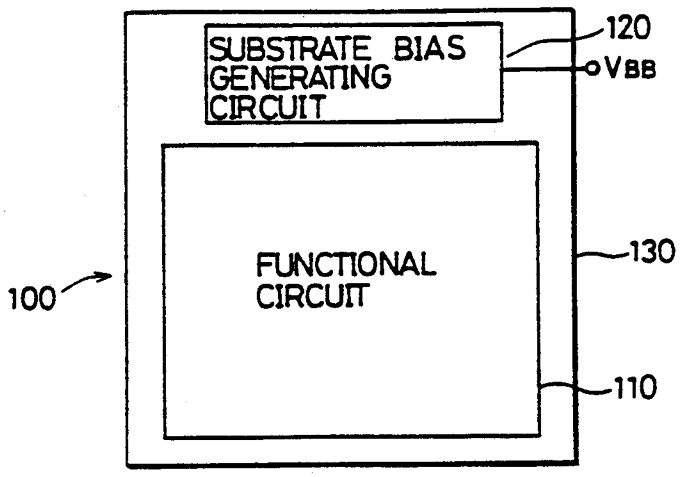
FIG. 6 PRIOR ART
FIG. 6 is a diagram showing entire structure of a semiconductor integrated circuit device having a substrate bias generating circuit.
Figure 7:
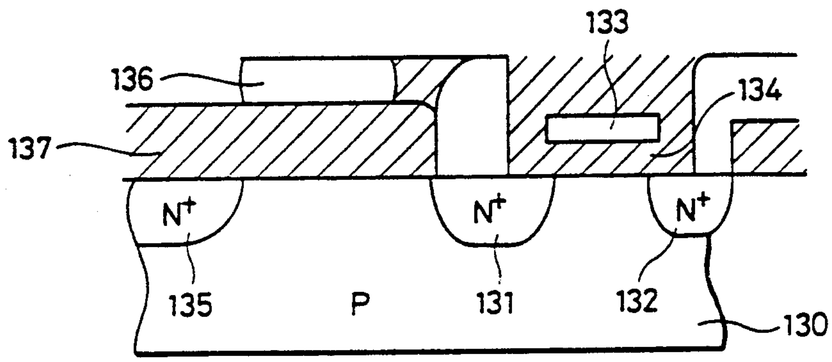
FIG. 7 PRIOR ART
FIG. 7 is a diagram illustrating one example of a sectional view of a semiconductor integrated circuit device having an MOS transistor as a component.
Figure 8:
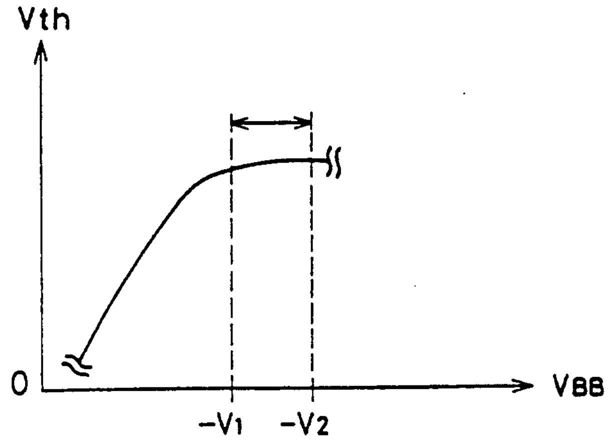
FIG. 8 PRIOR ART
FIG. 8 is a graph showing relationship between a threshold value voltage of a MOS transistor and potential of a substrate in which the MOS transistor is formed.
Figures 9A, 9B, 9C, 9D, 9E, 9F, 9G:
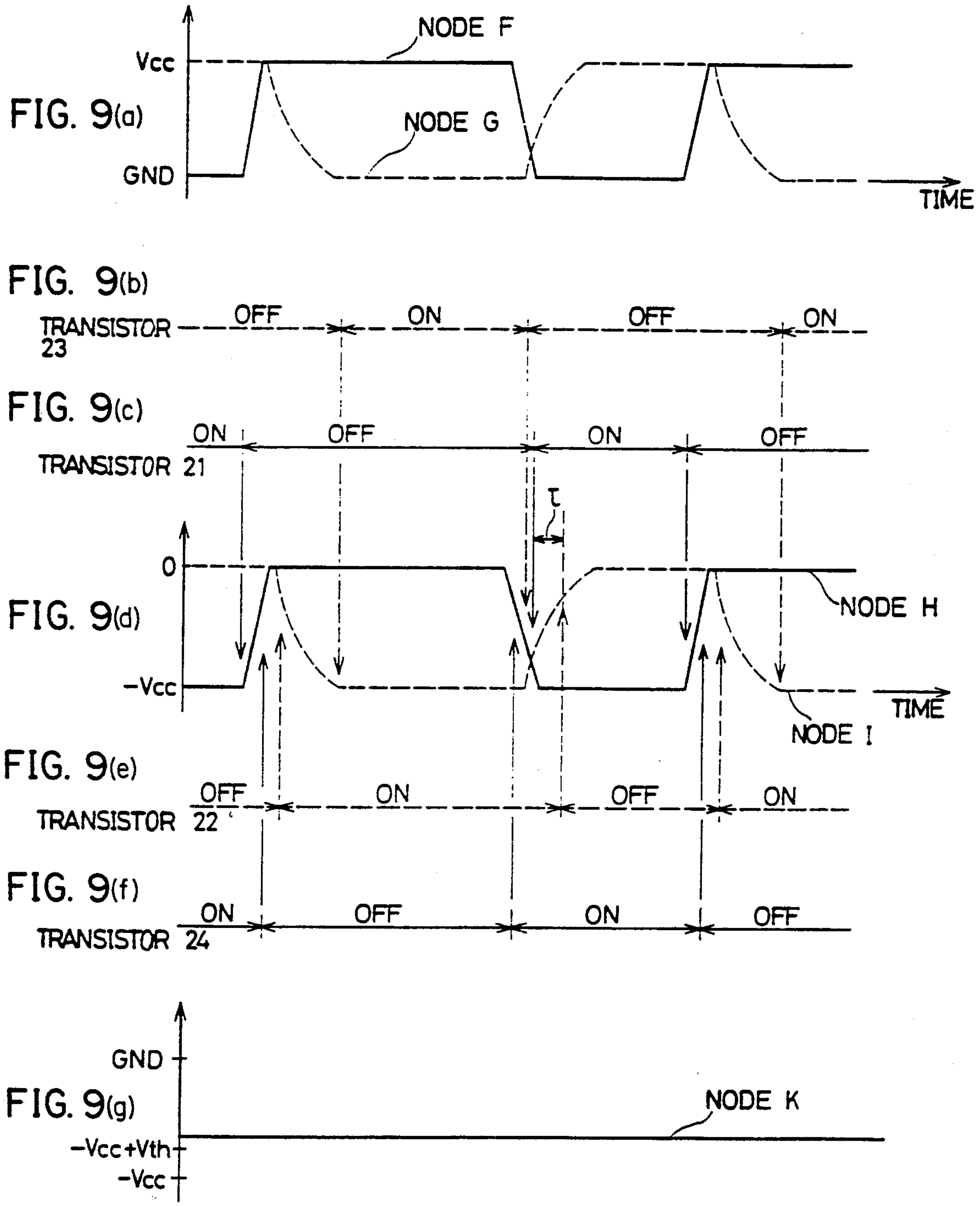
FIGS. 9(*a*)-9(*g*) are timing chart diagrams illustrating operation of charge pumps 50 and 51 when the capacitance of capacitor 20 is much larger than the capacitance of capacitor 19 in the substrate bias generating circuit of FIG. 4.
Figure 10:
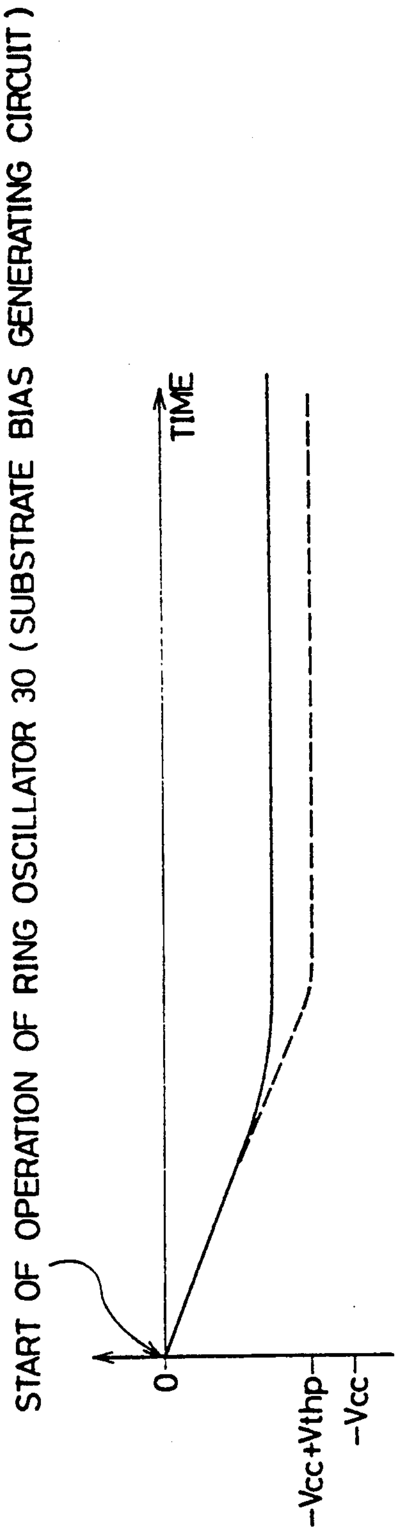
FIG. 10 is a graph illustrating change in the substrate potential in a semiconductor device in which a conventional substrate bias generating circuit is employed.

Ring oscillator 30 has the same structure as that in the conventional substrate bias generating circuit shown in FIG. 4. However, unlike the conventional case, not only output potentials of inverters 5 and 6 but also output potential of inverter 3 are used as outputs of ring oscillator 30. While waveform shaping circuit 40 shapes an output potential waveform of ring oscillator 30 on the basis of the potential of nodes B and C similarly to the conventional case, waveform shaping circuit 41 shapes an output potential waveform of ring oscillator 30 on the basis of potentials at nodes A and B.

Figures 3A, 3B, 3C, 3D, 3E, 3F, 3G, 3H:
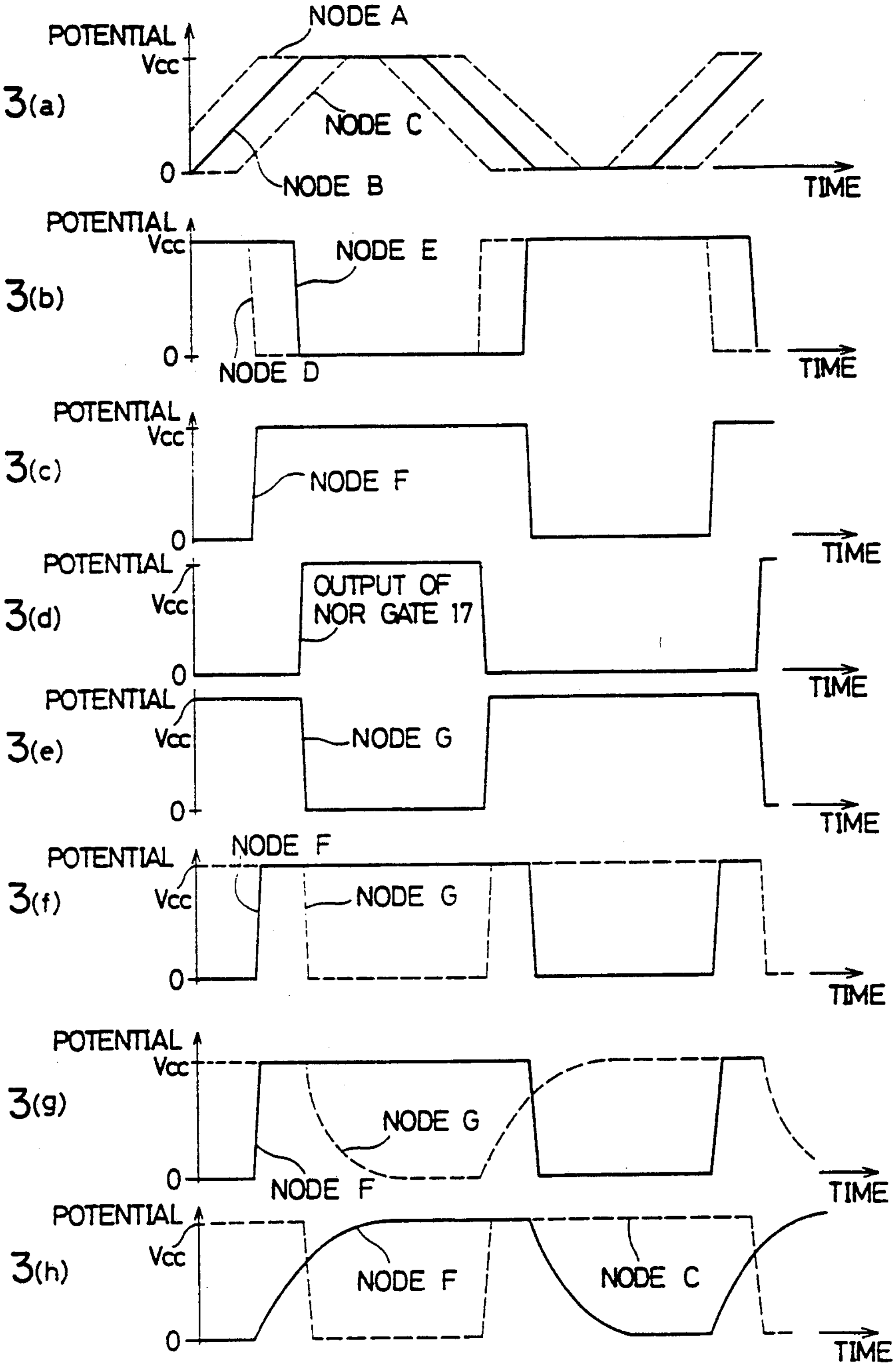
FIGS. 3(*a*)-3(*h*) are timing chart diagrams for describing operation of a substrate bias generating circuit shown in FIGS. 1 and 2.

FIG. 3 is a timing chart diagram for describing operation of a substrate bias generating circuit of the present embodiment. In the description below, FIG. 3 is also referred to.

As shown in FIG. 3 (*a*), potential waveforms of nodes A, B and C are substantially in phase, and the potential waveform at node A shows phase in advance of the potential waveform of node B by a delay time of two inverters, and the potential waveform of node C shows phase lagging behind the potential waveform of node B by the delay time of two inverters. Accordingly, the output potential waveform of waveform shaping circuit 40 and the output potential waveform of waveform shaping circuit 41 have difference in phase corresponding to the delay time of four inverters as shown in FIG. 3 (*b*).

Output potentials of waveform shaping circuits 40 and 41 are inputted into NOR gate 17 and NAND gate 16. An output of NAND gate 16 attains a low level only in a period where the potential of node E (output potential of waveform shaping circuit 40) and the potential at node D (output potential of waveform shaping circuit 41) are both at a high level, so that it shows the waveform shown in FIG. 3 (*c*). On the other hand, an output of NOR gate 17 attains a high level only in a period in which potentials of nodes E and D are both at a low level, so that it shows the waveform as shown in FIG. 3 (*d*). As seen from FIGS. 3 (*c*) and (*d*), different from a conventional case, a period in which an output of NOR gate 17 is at a high level is completely included in a period in which output potential of NAND gate 16 is at a high level. It will be revealed in the description below that such a relationship between the output potential waveform of NOR gate 17 and the output potential waveform of NAND gate 16 enables efficient operation of charge pump circuits 50 and 51.

An output of NOR gate 17 is applied to charge pump circuit 50 through delay circuit 60. Similarly, an output of NAND gate 16 is applied to charge pump circuit 51 through delay circuit 61. Similarly to a conventional case, an output terminal of charge pump circuit 50 and an output terminal of charge pump circuit 51 are connected to each other at a node K connected to semiconductor substrate 130. Delay circuits 60 and 61 are provided as needed for converting output potential waveforms of logic gates 16 and 17 so that negative charge of an amount corresponding to the negative voltage to be supplied to semiconductor substrate 130 are alternately accumulated in charge pump circuits 50 and 51 in response to outputs of two logic gates 16 and 17.

Figure 2:
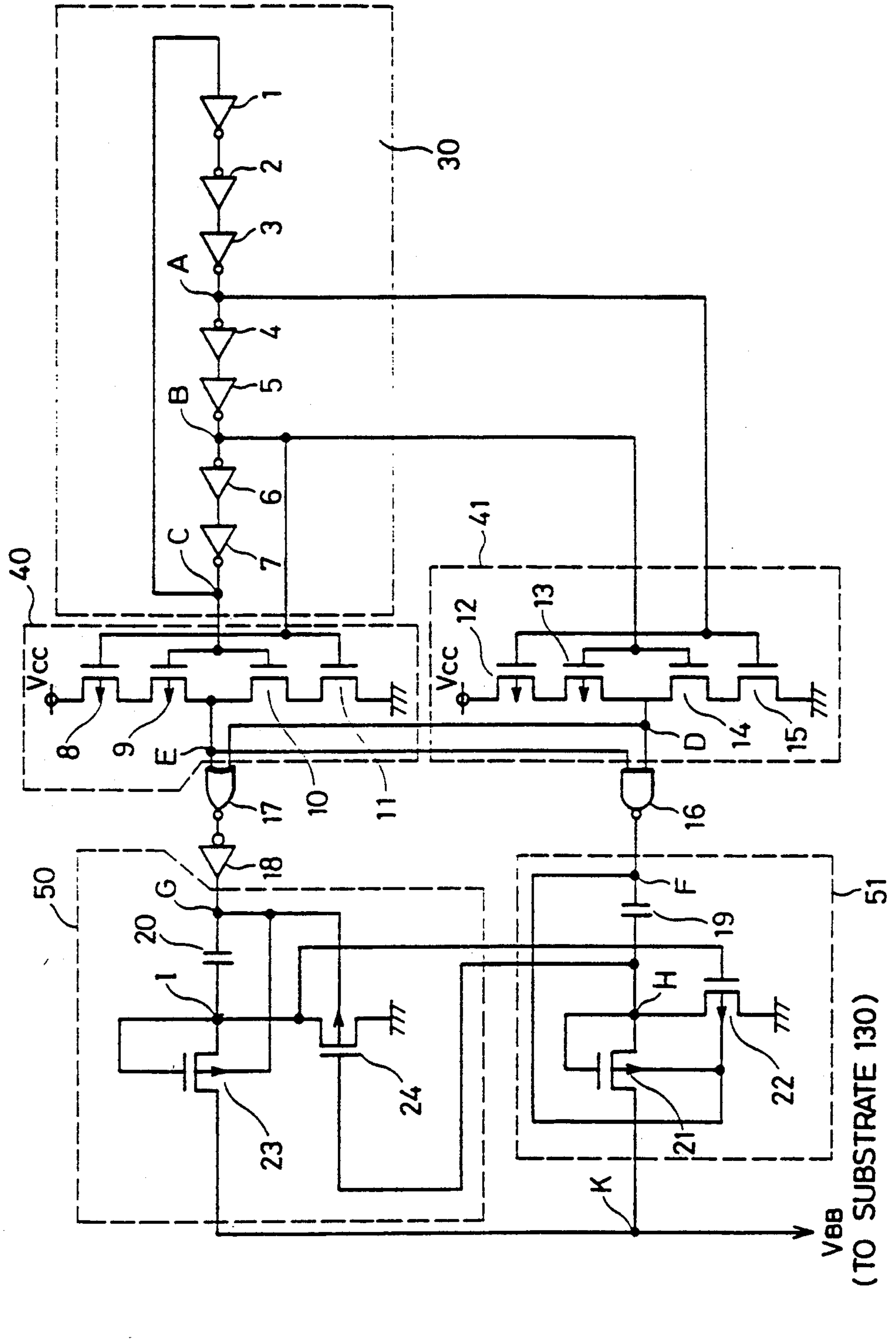
FIG. 2 is a circuit diagram specifically illustrating structure of a substrate bias generating circuit of an embodiment.

FIG. 2 is a circuit diagram showing specific configuration of a substrate bias generating circuit of the present embodiment. Referring to FIG. 2, waveform shaping circuits 40 and 41 have the same structure as conventional ones shown in FIG. 4. In waveform shaping circuit 41, potential at a node B is applied to gates of a p channel MOS transistor 13 and a n channel MOS transistor 14, and potential at a node A is applied to a p channel MOS transistor 12 and a n channel MOS transistor 15. In FIG. 1, delay circuits 60 and 61 are provided as needed in order to make phase of an input signal into charge pump circuit 50 and phase of an input signal into charge pump circuit 51 complimentary with each other. Specifically, since an output signal of NOR gate 17 and an output signal of NAND gate 16 are in the same phase, at least one of delay circuits 60 and 61 is required. As the one, an inverter is employed. When a plurality of inverters are used as either one of delay circuits 60 and 61, it is necessary to use inverters of which number is larger (or smaller) by one than the number of these inverters. In the present embodiment, an inverter 18 is employed as the above-described delay circuit 60, and the delay circuit 61 is not required since an input signal into charge pump circuit 50 and an input signal into charge pump circuit 51 are in opposite phase by using inverter 18 as delay circuit 60. Charge pump circuits 50 and 51 have the same structure as conventional ones shown in FIG. 4.

The potential waveform at node G shows phase which differs from the output potential waveform of NOR gate 17 substantially by 180°, which is shown in FIG. 3 (*e*). Accordingly, as shown in FIG. 3 (f), both of the time in which the potential of node F attains a high level and the potential at node G attains a low level, and the time in which the potential of node G attains a high level and the potential at node F attains a low level considerably increase as compared to conventional cases (compared with FIG. 5 (*f*)). Accordingly, when the capacitance of capacitor 19 and the capacitance of capacitor 20 are equal to each other and a rise speed and a fall speed of each of nodes F and G are fast as shown in FIG. 3 (*f*), charge pump circuits 50 and 51 respectively output to node K potential (−Vcc+Vthp) which is higher than negative potential (−Vcc) having an absolute value same as power supply potential Vcc by a threshold value voltage Vthp of a p channel MOS transistor in response to a fall of potential at node G and a fall of potential at node F. For example, when the potential at node G falls, node F has already attained power supply potential Vcc. Accordingly, when the potential of node G has fallen, node H is always at a high potential capable of bringing transistor 24 into an OFF state, so that the potential at node I decreases to −Vcc by negative charge discharged from capacitor 20. That is, predetermined negative potential (−Vcc+Vthp) is outputted as substrate bias $V_{BB}$ from charge pump circuit 50 in response to a fall of potential at node G. On the other hand, when the potential of node F falls, the potential at node G has already attained power supply potential Vcc. Accordingly, upon a fall of potential at node F, node I is necessarily at a high potential capable of bringing transistor 22 into an OFF state, so that the potential at node H decreases to −Vcc. Thus, the predetermined negative potential (−Vcc+Vthp) is outputted as substrate bias $V_{BB}$ from charge pump circuit 51 in response to a fall of charge of node F.

Next, suppose a case where the capacitance of capacitor 20 is much larger than the capacitance of capacitor 19. In such a case, as shown in FIG. 3 (*g*), the fall and the rise of the potential at node F are made rapidly, but the rise and the fall of the potential at node G are very slow. In a conventional substrate bias generating circuit, when such a phenomenon occur, a period in which potentials at both of nodes F and G attain a low level occurs to cause a problem that substrate bias $V_{BB}$ outputted by charge pump circuits 50 and 51 output potential higher than potential originally to be outputted (−Vcc+Vthp). In the present embodiment, however, as clearly seen from FIG. 3 (g), when the potential at node F falls, the node G is already at a high level, so that the potential at node I has increased to potential capable of bringing transistor 22 into an OFF state. Accordingly, the potential at node H surely decreases to −Vcc in response to fall of potential at node F, so that predetermined negative potential (−Vcc+Vthp) is outputted from charge pump circuit 51. When node G falls, the potential at node F is already power supply potential Vcc, so that the potential at node I decreases to −Vcc and then predetermined negative potential (−Vcc+Vthp) is outputted from charge pump circuit 50.

FIG. 11 is a timing chart illustrating operation of charge pumps 50 and 51 when the capacitance of capacitor 20 is extremely larger than the capacitance of capacitor 19. Referring to FIG. 11, the potential change at nodes in charge pump circuits 50 and 51 in FIG. 2 will be described more specifically below.

Different from a conventional case, as shown in FIG. 11 (a), the potential at node G starts falling when a certain time has passed after the potential at node F had risen to a high level and starts increasing at a time earlier than the fall time of the potential at node F, so that, as shown in FIGS. 11 (b) and (c), transistor 23 switches from an ON state to an OFF state at a time earlier than the switch of transistor 21 from an OFF state to an ON state. Furthermore, as shown in FIGS. 11 (e) and (f), transistor 22 switches from an OFF state to an ON state later than a conventional case after transistor 24 changes from an ON state to OFF state, and switches from an ON state to an OFF state earlier than a conventional case after transistor 24 changes from an OFF state to an ON state.

Accordingly, the potential at node I starts falling sufficiently later than a rise of potential at node H (shown by the solid line in FIG. 11 (d)) and starts rising sufficiently earlier than a fall of potential at node H. Accordingly, an instance at which transistor 22 attains an ON state does not occur in a period during which transistor 21 is in an ON state, so that the phenomenon of node K being grounded does not occur. That is, the potential at node K is stabilized at original output potential (−Vcc+Vthp) of transistors 21 and 23 in the case where gate potential is −Vcc as shown in FIG. 11 (g).

On the other hand, suppose a case in which capacitance of capacitor 19 is extremely larger than the capacitance of capacitor 20. In such a case, conventionally, a period occurs in which transistor 24 is brought into an ON state when the potential at node G is at a low level to cause a problem that potential higher than predetermined potential is outputted from charge pump circuit 50. However, in the present embodiment, as shown in FIG. 3 (h), the fall of potential of node F is not sharp, but the potential at node F has already attains a high level when the potential at node G falls. Accordingly, when potential at node G falls, node H is already at potential capable of bringing transistor 24 into an OFF state. Accordingly, the potential at node I surely decreases to −Vcc in response to a fall of potential at node G. That is, charge pump circuit 50 surely outputs predetermined negative potential (−Vcc+Vthp) in response to a fall of potential at node G. When the potential at node F falls, the potential at node G has already attained power supply potential Vcc, so that charge pump circuit 51 surely outputs predetermined negative potential (−Vcc+Vthp) in response to a fall of potential at node F.

Figure 12:
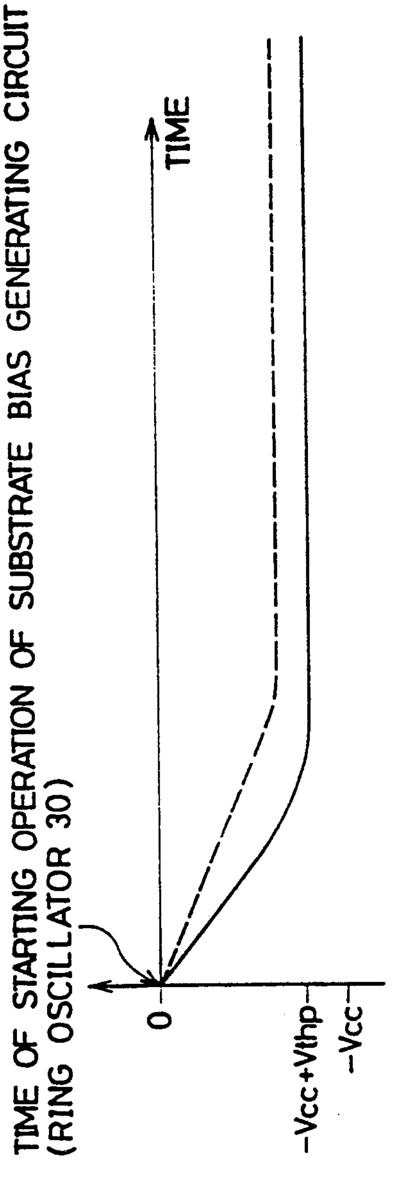
FIG. 12 is a graph illustrating change in substrate potential in a semiconductor device in which a substrate bias generating circuit of the present invention is employed.

FIG. 12 is a graph schematically illustrating change of substrate potential (potential at node K) from a time at which the substrate bias generating circuit starts operating in a semiconductor device in which the substrate bias generating circuit of the present invention is used. In FIG. 12, the case is illustrated in which the substrate potential just before operation of the substrate bias generating circuit is 0V. Also, in FIG. 12, the broken line indicates change of the substrate potential in a semiconductor device in which a conventional substrate bias generating circuit is used.

Referring to FIG. 12, in the semiconductor device in which the substrate bias generating circuit of the present invention is used, the potential at node K starts falling at a speed faster than that in the semiconductor device in which the conventional substrate bias generating circuit is used in response to start of operation of ring oscillator 30 as shown by the solid line, and becomes stable at −Vcc+Vthp which is potential lower than the potential forced by the conventional substrate bias generating circuit. That is, according to the present invention, the substrate is biased more rapidly than the conventional case to potential lower than the conventional case.

As described above, according to the substrate bias generating circuit of the present invention, as an instance at which node K connected to the substrate is grounded in either one of charge pumps 50 and 51 does not occur, a decrease of potential at node K is not prevented. As a result, the potential of node K falls more rapidly than a conventional case.

As described above, in the substrate bias generating circuit, since signals having large difference in phase are inputted into charge pump circuits 50 and 51, even if the capacitance of capacitor 19 and the capacitance of capacitor 20 extremely differ from each other, negative potential can be obtained efficiently from charge pump circuits 50 and 51.

As the difference in capacitance between capacitor 19 and capacitor 20 is made larger, the difference between a fall speed at node G and a rise speed of node F and the difference between a fall speed at node F and a rise speed of node G increase. Accordingly, a time in which the potential at node G attains a low level after the potential at node F attains a high level, and a time in which the potential at node F attains a low level after the potential at node G attains a high level are shortened. Accordingly, for surely placing the potential at node F at a high level upon a fall of potential at node G and surely placing the potential at node G at a high level upon a fall of the potential at node F, the difference in phase between the output potential of NOR gate 17 and the output potential of NAND gate 16 must be set according to the difference between capacitance of capacitor 19 and capacitance of capacitor 20. Of course, as the phase difference becomes larger, the difference in capacitance between capacitors 19 and 20 which will produce a period in which both of potentials at nodes F and G are at the low level increases. That is, as the phase difference is larger, the risk of occurrence of a period in which both of potentials at nodes F and G are at the low level decreases. The phase difference between output potential of NAND gate 16 and output potential of NOR gate 17 increases as the phase difference between potential at node D and potential at node E, that is, the phase difference between potential at node A and potential at node C increases. Accordingly, in order to make large operation margin of charge pump circuits 50 and 51, a determination as to which of output potentials of inverters 1–7 are to be used as an outputs of ring oscillator 30 should be made so that the difference in phase between input potential into waveform shaping circuit 40 and input potential of waveform shaping circuit 41 becomes larger.

In practice, when a ring oscillator in which oscillating frequency is set to be long for decreasing consumption power is employed in each of a conventional substrate bias generating circuit shown in FIG. 4 and a substrate bias generating circuit of the present embodiment, the difference in phase between potential at node D and potential at node E in the present embodiment can be one hundred times that of the conventional one. Accordingly, according to the present embodiment, the operation margin of charge pump circuits 50 and 51 can be made extremely larger as compared to the conventional case.

As described above, according to the present embodiment, without adding a new delay circuit for avoiding occurrence of a period in which potentials at both nodes F and G attain a low level, and without increasing sizes of a logic gate or the like provided in a previous stage of charge pump circuits 50 and 51, predetermined negative potential can be surely obtained from charge pump circuits 50 and 51 even when capacitance of capacitor 19 and capacitance of capacitor 20 differ from each other.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A substrate bias generating circuit for providing a bias voltage to a semiconductor substrate as substrate bias, comprising a ring oscillator having a plurality of inverter means serially connected in a ring;

first signal generating means responsive to a first and a second output signal of said ring oscillator for supplying a first logic signal having a periodically inverting logical level;

second signal generating means responsive to the second and a third output signal of said ring oscillator for supplying, in a first period in which an output signal of said first signal generating means is at a first logic level, a second logic signal having a second logic level during said first period for a second period shorter than said first period, and having said first logic level in other periods;

first charge pump means including a first capacitance coupling element charged in response to said first logic signal having said first logic level from said first signal generating means and first discharge means for discharging said first capacitance coupling element to said semiconductor substrate responsive to said second logic signal having said first logic level; and second charge pump means including a second capacitance coupling element charged in response to said second logic signal having said first logic level from said second signal generating means and second discharge means for discharging said second capacitance coupling element to said semiconductor substrate responsive to said first logic signal having first level.

2. The substrate bias generating circuit according to claim 1, wherein said ring oscillator generates a plurality of signals including the first, second and third output signals having predetermined phase differences from each other, said first signal generating means comprises first signal producing means and first logic gate means, and said second signal generating means comprises second signal producing means and second logic gate means, said first signal producing means produces a fourth signal in response to said first and second output signals, said second signal producing means generates a fifth signal having predetermined phase difference from that of said fourth signal in response to said second and third output signals, said first logic gate means outputs a signal at said second logic level when both of said fourth and fifth signals are at a predetermined logic level, and said second logic gate means outputs a signal at said first logic level when at least one of said fourth and fifth signal is at said predetermined logic level.

3. The substrate bias generating circuit according to claim 2, wherein said first logic gate means comprises 2-input NAND gate using said fourth and fifth signals as inputs, and, said second logic gate means comprises 2-input OR gate using said fourth and fifth signals as inputs.

4. The substrate bias generating circuit according to claim 1, wherein said first signal producing means comprises first waveform shaping means for waveform-shaping said first output signal in response to said second output signal, and said second signal producing means comprises second waveform shaping means for waveform-shaping said third output signal in response to said second output signal.

5. The substrate bias generating circuit according to claim 1, wherein said first logic level is a high level and said second logic level is a low level.

6. The substrate bias generating circuit according to claim 3, wherein said first charge pump means further comprises a first switching element connected between said first capacitance coupling element and a predetermined potential source and controlled by an output of said second logic gate means, and said second charge pump means further comprises a second switching element connected between said second capacitance coupling element and said predetermined potential source and controlled by an output of said first logic gate means.

7. The substrate bias generating circuit according to claim 6, wherein first discharge means comprises a third switching element for electrically connecting said first capacitance coupling element to said substrate in response to an output signal at said second logic level of said first signal generating means, and second discharge means comprises a fourth switching element for electrically connecting said second capacitance coupling element to said substrate in response to an output signal at said second logic level of said second signal generating means.

8. A substrate bias generating device for providing predetermined voltage to a semiconductor substrate as substrate bias, comprising:

first charge pump means including first capacitance coupling element charged in response to a signal at a first logic level and first electric path circuit means for coupling said first capacitance coupling element to ground;

second charge pump means including a second capacitance coupling element charged in response to a signal at said first logic level and second electric path circuit means for coupling said second capacitance coupling element to ground;

each of said first and second electric path circuit means being activated in response to a signal of a second logic level;

oscillating means for generating a periodic signal;

first signal providing means responsive to the oscillating means for applying a signal at said first logic level in predetermined periods at constant intervals to said first capacitance coupling element;

second signal providing means responsive to the oscillating means for providing, in said predetermined period in which an output signal of said first signal providing means attains said first logic level, a signal at said second logic level to said second capacitance coupling element in a periods shorter than said predetermined periods, and for providing a signal at said first logic level in other periods;

first connecting means for electrically connecting a connection point of said first capacitance coupling element and said first electric path circuit means to said substrate in response to a signal at said second logic level from said first signal providing means; and second controlling means for electrically connecting a connecting point of said second capacitance coupling element and said second electric path circuit means to said substrate in response to a signal at said second logic level from said second signal providing means.

9. The substrate bias generating device according to claim 2, wherein said first, second and third signals are outputs of different three inverter means of said plurality of inverter means.

10. A semiconductor device with a substrate bias generating circuit for applying a substrate bias potential to said substrate, said substrate bias generating circuit comprising:

a signal generating means for generating first through third signals, said second signal being delayed with respect to said first signal, said third signal being delayed with respect to said second signal;

first waveform shaping means responsive to said first and second signals for providing a first shaped signal;

second waveform shaping means responsive to said third and second signals for providing a second shaped signal;

first logic means responsive to said first and second shaped signals for providing a first logic signal;

second logic means responsive to said first and second shaped signals for providing a second logic signal which relates to an inverted signal of said first logic signal;

a first charge pump means including a first capacitance coupling element charged in response to said first logic signal and an output node connected to said substrate; and a second charge pump means including a second capacitance coupling element charged in response to said second logic signal and an output node connected to said substrate.

11. A substrate bias generating circuit for providing a bias voltage to a semiconductor substrate comprising:

an oscillator for providing a reference signal and first and second clock signals of first and second phases;

a first signal generator responsive to said reference signal and said first clock signal for supplying a periodically inverting first charge pump control signal having a first level for a first period of each cycle and a second level for a second period of each cycle;

a second signal generator responsive to said reference signal and said second clock signal for supplying a periodically inverting second charge pump control signal having said second level during each cycle only during the first period of said first charge pump control signal and for a period less than said first period;

first charge pump means including a first capacitor and a first switching means, said first switching means responsive to said first level of said first charge pump control signal for charging said first capacitor and to said first level of said second charge pump control signal for discharging said first capacitor to said semiconductor substrate; and second charge pump means including a second capacitor and a second switching means, said second switching means responsive to said first level of said second charge pump control signal for charging said first capacitor and to said second level of said first charge pump control signal for discharging said second capacitor to said semiconductor substrate.

12. The substrate bias generating circuit according to claim 11, wherein said first level is a logical high level and said second level is a logical low level.

13. A method of operating a substrate bias generating circuit providing a bias voltage to a semiconductor substrate as substrate bias and including a first capacitance coupling element charged in response to a first signal at a first logic level and discharged to said semiconductor substrate in response to a second signal having a first logic level, and a second capacitance coupling element charged in response to said second signal at said first logic level and discharged to said semiconductor substrate in response to said second signal having said first logic level, said operating method comprising the steps of:

generating said first signal which has a periodically inverting logic level;

generating said second signal which attains, in a first period in which said generated first signal is at said first logic level, said second logic level during said first period for a second period shorter than said first period and attains said first logic level in other periods;

supplying said generated first signal to said first capacitance coupling element;

supplying said generated second signal to said second capacitance coupling element;

electrically connecting said first capacitance coupling element to a predetermined potential source in response to said second signal having said second logic level; and electrically connecting said second capacitance coupling element to said potential source in response to said first signal having said second logic level.

* * * * *